United States Patent
Chen et al.

(10) Patent No.: US 7,288,876 B2
(45) Date of Patent: Oct. 30, 2007

(54) NON-SYMMETRIC DRIVE TYPE PIEZOELECTRIC CERAMIC TRANSFORMER

(75) Inventors: Yaoqiang Chen, Xi An (CN); Quanbao Liu, Xi An (CN)

(73) Assignee: Xi'an Kong Hong New Materials Sci-Tech Co., Ltd., Shanxi Province (CN)

( * ) Notice: Subject to any disclaimer, the term of this patent is extended or adjusted under 35 U.S.C. 154(b) by 131 days.

(21) Appl. No.: 10/542,440

(22) PCT Filed: Jun. 5, 2003

(86) PCT No.: PCT/CN03/00440

§ 371 (c)(1),
(2), (4) Date: Jul. 15, 2005

(87) PCT Pub. No.: WO2004/086525

PCT Pub. Date: Oct. 7, 2004

(65) Prior Publication Data

US 2006/0113877 A1    Jun. 1, 2006

(30) Foreign Application Priority Data

Mar. 25, 2003 (CN) .............................. 03 1 14571

(51) Int. Cl.
*H01L 41/107* (2006.01)
(52) U.S. Cl. ...................................................... 310/359
(58) Field of Classification Search ................. 310/359
See application file for complete search history.

(56) References Cited

U.S. PATENT DOCUMENTS 5,892,318 A * 4/1999 Dai et al. .................... 310/358
6,084,336 A * 7/2000 Kawasaki et al. ........... 310/359
6,278,226 B1   8/2001 Danov et al.
6,291,925 B1 * 9/2001 Jacobson ..................... 310/319

FOREIGN PATENT DOCUMENTS

JP    7-176804 A    7/1995
JP    8-139383 A    5/1996

(Continued)

*Primary Examiner*—Thomas M. Dougherty
(74) *Attorney, Agent, or Firm*—Birch, Stewart, Kolasch & Birch, LLP

(57) ABSTRACT

A non-symmetric drive type piezoelectric ceramic transformer has been disclosed in the present invention. The non-symmetric drive type piezoelectric ceramic transformer has a rectangular piezoelectric ceramic conductor. Along the length of rectangular piezoelectric ceramic conductor, it is divided into three zones: the first zone is the oscillation node accommodate zone of the length adjusting, that the change of length can adjust the resonance frequency and the oscillation node of the piezoelectric ceramic transformer; the second zone is input drive zone, which upper of lower surface have been coated with electrodes and polarized in the direction of the thickness; the third zone is the output generation zone, which output terminals are coated with electrodes and polarized in the direction of the length of the conductor. The piezoelectric ceramic transformer having above structure has the advantages of smaller dimension, less input phase changes, less generating heat, higher efficiency, and the piezoelectric ceramic transformer has the adjustable resonance frequency and the oscillation node, simply formation process, lower cost of fabrication. The piezoelectric ceramic transformer can be used in high voltage power sources, and back-light sources of liquid crystal display to drive cold cathode florescent lamps.

13 Claims, 2 Drawing Sheets

FOREIGN PATENT DOCUMENTS

| | | | |
|---|---|---|---|
| JP | 08-191161 | * | 7/1996 |
| JP | 09-83032 | * | 3/1997 |
| JP | 09-92901 | * | 4/1997 |
| JP | 09-116205 | * | 5/1997 |
| JP | 10-200174 A | | 7/1998 |

* cited by examiner

NON-SYMMETRIC DRIVE TYPE PIEZOELECTRIC CERAMIC TRANSFORMER

BACKGROUND

1. Field of the Invention

The present invention relates to a piezoelectric ceramic transformer, in particular, to a non-symmetric drive type piezoelectric ceramic transformer, which has simply formation process, high boosting ratio, high conversion efficiency, adjustable resonance frequency and oscillation node. The present invention belongs to the electronic technique.

2. Description of Related Art

At present, there are two kinds of common piezoelectric ceramic transformer, i.e. Rosen type piezoelectric ceramic transformer and Center type piezoelectric ceramic transformer.

As shown in FIGS. 1 and 2, Rosen type piezoelectric ceramic transformer is a rectangular piezoelectric which is divided into two half-zones, the left zone 1 is called as input drive zone, the both surface of which are coated with electrodes 11 and is polarized along its thickness; the right zone 2 is called as output generation zone, the end of which is coated with electrode 21, and is polarized along its length. This structure of Rosen type piezoelectric ceramic transformer has mainly two oscillation modes, $\lambda/2$ and $\lambda$. In practical applications, the higher the resonance frequency of a transformer, the greater the loss is, so that the piezoelectric ceramic transformer is usually operated in oscillation mode $\lambda/2$. When it is operating on oscillation mode $\lambda/2$, the null displacement oscillation node is at the center of the transformer, the oscillation displacement of output head of the right zone 2 is equal to that of the left zone 1, the oscillating displacement diagram is a symmetric diagram. The advantage of Rosen type piezoelectric ceramic transformer is simple in manufacturing engineering. Its advantage is as follows: high manufacturing cost resulting from large electrode areas of input drive zone, large input capacitance, large phase, low boosting ratio, low conversion efficiency and unadjustable resonance frequency and oscillation node.

As shown in FIGS. 3 and 4, the Center type piezoelectric ceramic transformer is a rectangular piezoelectric, which is divided into three zones: the middle zone 3 is an input drive zone, the upper and lower surface of which is coated with electrode 31, and which is polarized along its thickness; the both side of which is output generation zone 4 and 5, each head is coated with electrode 41, 51, and which is polarized along their length, the both output generation zone is symmetrical and has the same phase. In practical application they are joining-up in parallel. The Center type piezoelectric ceramic transformer mainly has two oscillation modes, i.e., $\lambda/2$ and $3\lambda/2$. When it is operated on oscillation mode $\lambda/2$, the null displacement oscillation node is at the center of the transformer, the oscillating displacement of both output head is equal, and the oscillating displacement diagram is the diagram of symmetry type. The advantage of Center type piezoelectric ceramic transformer is high boosting ratio, while the disadvantage is as follows: complex manufacturing engineering, high manufacturing cost, high requirements for balancing degree of the two generation zones, modulation phenomena resulting from the addition of waveforms when joining-up in parallel, and unadjustable resonance frequency and oscillation node.

SUMMARY

To overcome above problems existing in the present piezoelectric ceramic transformer: complex structure, high manufacturing cost, low conversion efficiency, low boosting ratio, unadjustable oscillation node, the object of the present is to provide a new type piezoelectric ceramic transformer which is simple in structure, low in cost, high in conversion efficiency, high in boosting ratio, and adjustable in oscillation node.

To achieve above objects, the invention takes following technical project: an non-symmetric drive type piezoelectric ceramic transformer, which is comprised of a rectangular piezoelectric conductor which is divided into three zones along its length: the first zone is a oscillation node adjustment zone, the length of which can be adjusted, so as to regulate the resonance frequency and oscillation node of the piezoelectric transformer; the second zone is a input drive zone, the upper and lower surface is coated with electrodes, and is polarized along its thickness; the third zone is an output generation zone, the output head is coated with electrodes, and is polarized along its length.

Said non-symmetric drive type piezoelectric ceramic transformer has three optional oscillation modes: $\lambda/2$, $\lambda$, $3\lambda/2$, of which the oscillation mode $\lambda/2$ has optimum output power and boosting ratio, when operating in oscillation mode $\lambda/2$, the null displacement oscillation node is at the center of the transformer and the oscillating displacement of the output head is larger than that of input head, with the oscillating displacement diagram belonging to non-symmetric type diagram.

The piezoelectric conductor of said non-symmetric drive type piezoelectric ceramic transformer can be a single-layer piezoelectric conductor, or a piezoelectrics comprising several single-layer piezoelectric conductor which are overlapped each other and passing through the monolithic process to form a multi-layer transformer.

The polarization direction on input drive zone of said non-symmetric drive type piezoelectric ceramic transformer is from top to bottom or from bottom to top; while the polarization direction of output generation zone is right or lift along its length.

The invention has following advantages: simple manufacturing engineering, low manufacturing cost, small input phase, large effective input power, high conversion efficiency, and high boosting ratio. Because the length of oscillation node adjustable zone is adjusted according to the requirements, the invention can adjust the resonance frequency and oscillation node of the transformer in accordance with the design requirement.

In above views, L denotes the length of a piezoelectric conductor, W demotes the width of the piezoelectric conductor, H denotes the thickness of the piezoelectric conductor, the black section denotes that the piezoelectric conductor is coated with electrodes, arrow denotes the polarization direction of the piezoelectric conductor.

DETAILED DESCRIPTION

Figure 1:
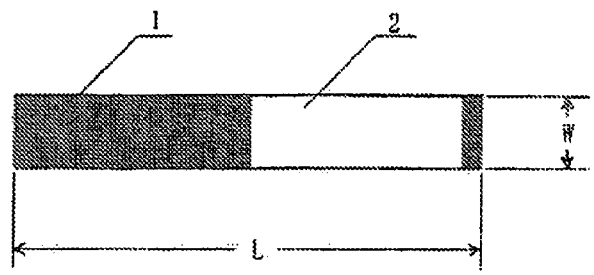
FIG. 1 is a top plan view of conventional Rosen type piezoelectric ceramic transformer.
Figure 2:
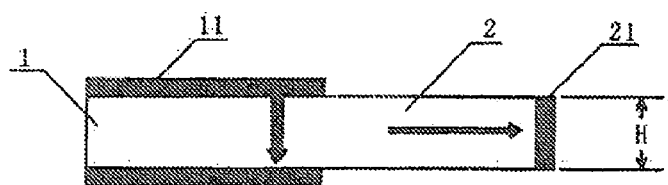
FIG. 2 is a front view of conventional Rosen type piezoelectric ceramic transformer.
Figure 3:
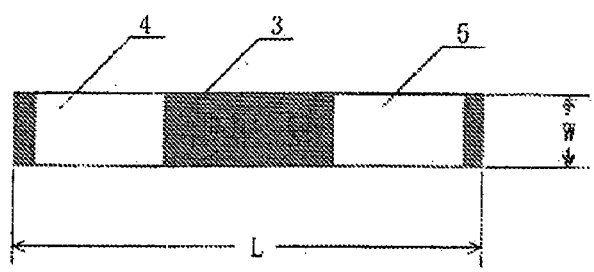
FIG. 3 is a top plan view of conventional Center type piezoelectric ceramic transformer.
Figure 4:
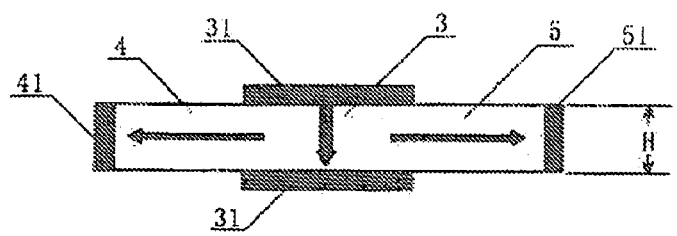
FIG. 4 is a front view of conventional Center type piezoelectric ceramic transformer.
Figure 5:
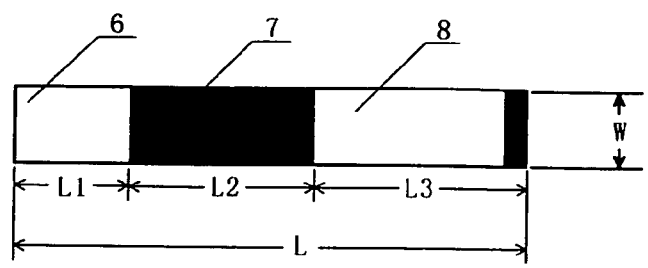
FIG. 5 is a top plan view of the non-symmetric drive type piezoelectric ceramic transformer of the present invention.
Figure 6:
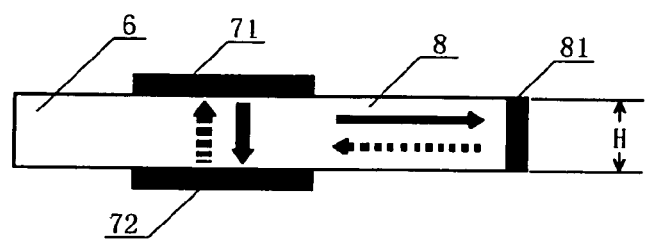
FIG. 6 is a front view of the non-symmetric drive type piezoelectric ceramic transformer of the present invention.

As shown in FIGS. 5 and 6, the non-symmetric drive type piezoelectric ceramic transformation of the present invention is a rectangular piezoelectric conductor, which is divided into three zones: the left zone is the oscillation node adjustment zone 6, the length of which is adjustable; the middle zone is the input drive zone 7; and the right zone is the output generation zone 8.

The oscillation node adjustment zone 6 located at the left of the piezoelectric conductor is a block of ceramic, the length L1 of which can be adjusted so as to adjust the resonance frequency and oscillation node of the transformer. With the increment of length L1, the resonance frequency of the transformer decreases and the oscillation node shifts left, while with the decrement of length L1, the resonance frequency of the transformer raises and the oscillation node shifts right. Through changing the length L1 of the oscillation node adjustment zone 6, the present invention can select the optimum resonance frequency and oscillating displacement of the piezoelectric ceramic transformer, so as to increase the output voltage and the capacity to drive load of the transformer.

The input drive zone 7 is located at the middle of the piezoelectric conductor with its length L2, width W and thickness H, the upper and lower surface of which is coated with electrode 71, 72 respectively; and is polarized along its thickness H, with the polarization direction being either from top to bottom (along solid-line arrow) or from bottom to top (along dash-line arrow). The input drive zone serves mainly to fulfill energy conversion, when a low voltage driving signal is applied to the input drive zone 7, if its drive frequency is equal to the inherent frequency of the transformer, resonance takes place, thus resulting in a mechanical deformation on the transformer and producing oscillating displacement, so as to transform the electrical energy into mechanical energy, i.e. to produce so called reverse piezoelectricity effect.

Said output generation zone 8 is located at the right of the piezoelectric conductor with its length L3, width W and thickness H, on the right head of which an electrode 81 is coated, and is polarized along its length, with the polarization direction being right (along solid-line arrow) or left (along dash-line arrow), as shown in FIG. 6. The output generation zone serves mainly to propagate the standing wave and fulfill high-voltage transformation, thus resulting in continuous accumulation of charges on the output head, so as to produce a high-voltage electric signal output and transform the mechanical energy into electrical energy, i.e., to produce so called positive piezoelectricity effect.

Said non-symmetric drive type piezoelectric ceramic transformer has mainly three optional oscillation modes, i.e., $\lambda/2$, $\lambda$, $3\lambda/2$, of which oscillation mode $\lambda/2$ has the best output power and boosting ratio, when the transformer is operating at oscillation mode $\lambda/2$, the null displacement oscillation node is located at the center of the transformer, and the oscillating displacement of output head is larger than that of input head, with the oscillating displacement diagram belonging to the non-symmetric type diagram.

The non-symmetric drive type piezoelectric ceramic transformer can be classified into two categories: the single-layer transformer is comprised of a single-layer piezoelectric conductor, and the multi-layer transformer is comprised of several single-layer transformers which are added together and passing through a monolithic process.

Figure 7:
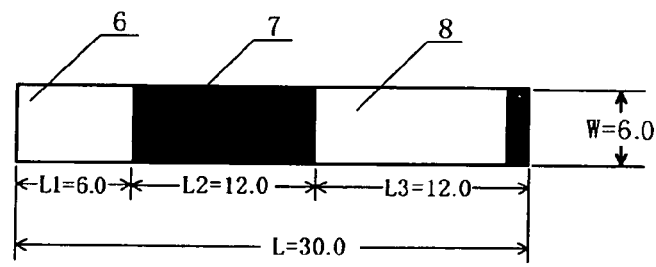
FIG. 7 is a top plan view of embodiment in accordance with the present invention.
Figure 8:
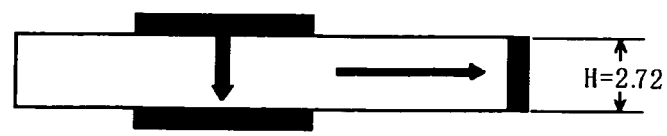
FIG. 8 is a front view of embodiment in accordance with the present invention.

As shown in FIGS. 7 and 8, a 4 W piezoelectric transformer used in the display of a portable computer is designed and manufactured according to above-mentioned non-symmetric drive type piezoelectric ceramic transformer. It is comprised of 13~19 layers of single-layer piezoelectric conductor, with the length, width and thickness of 30 mm, 6.0 mm, 0.14-0.25 mm, respectively, which are added together and passing through a monolithic process. Its middle input drive zone 7 is 12.0 mm long, on the upper and lower surface of which an electrode is coated, and is polarized along its thickness. On the left hand is a block of ceramics of 6.0 mm long, called as oscillation node adjustable zone 6. On the right hand is output generation zone 8 of 12.0 mm long, on the right head of which an electrode is coated and which is polarized along its length.

Through testing, the piezoelectric transformer manufactured in practice has an operating voltage of 3-22V, rated output power of 4 W (4.5 W max), conversion efficiency of 90% or more, boosting ratio of 80 or more, besides, its output head has strong loading capacity to drive a cold light lamp, the length of cold light lamp is within 80 to 400 mm, and its finished product has small volume and work stably thus meeting the needs.

Following table compares the invention with Rosen and Center type piezoelectric ceramic transformer:

| | Feature | | |
|---|---|---|---|
| Style | non-symmetric drive type | Rosen type | Center type |
| Structure | A block of piezoelectric conductor is divided into three zones: Oscillation node adjustment zone, input drive zone and output generation zone, a block of ceramic is added to the input drive head. | A block of piezoelectric conductor is divided into two zones: input drive zone and output generation zone. | A block of piezoelectric conductor is divided evenly into three zones: a middle input drive zone and two generation zones, each attaches a generation head. |
| Main oscillation mode | $\lambda/2$, $\lambda$, $3\lambda/2$, | $\lambda$, $\lambda/2$, | $\lambda/2$, $3\lambda/2$, |

-continued

| Style | Feature | | |
|---|---|---|---|
| | non-symmetric drive type | Rosen type | Center type |
| Drive pattern | When operating at mode λ/2, the null displacement node is located at the center of the piezoelectric conductor, the oscillating displacement of output head is greater than that of input head, which belongs to the non-symmetric drive. | When operating at mode λ/2, the null displacement node is located at the center of the piezoelectric conductor, the oscillating displacement of output head is equal to that of input head, which belongs to the symmetric drive. | When operating at mode λ/2, the null displacement node is located at the center of the piezoelectric conductor, the oscillating displacement of one output head is equal to that of another output head, which belongs to the symmetric drive. |
| Advantages and disadvantages | Advantages: simple manufacturing engineering, low manufacturing cost, less heat generation, high boosting ratio, small input phase, large effective input power, high conversion efficiency, adjustable resonance frequency and oscillation node. | Advantage: simple manufacturing engineering. disadvantage: large area of input electrode, high manufacturing cost, large input capacitance, large phase, low boosting ratio, low conversion efficiency, unadjustable resonance frequency and oscillation node. | Advantage: high boosting ratio. Disadvantages: complex manufacturing engineering, high manufacturing cost, high requirements for balancing two generation heads, modulation phenomena resulting from addition of waveforms, unadjustable resonance frequency and oscillation node. |

In a word, the non-symmetric drive type piezoelectric ceramic transformer according to the invention can take non-symmetric drive mode. In fabrication, the resonance frequency and oscillation node of the transformer can be adjustable by means of the regulation of the length of the oscillation node adjustable zone easily.

The invention claimed is:

1. A non-symmetric drive piezoelectric ceramic transformer comprising:
   a rectangular piezoelectric conductor,
   wherein said rectangular piezoelectric conductor is divided into a first zone, a second zone, and a third zone along its length,
   the first zone being an oscillation node adjustment zone, the length of which is adjustable, so as to so as to be able to adjust a resonance frequency and oscillation node of said piezoelectric transformer;
   the second zone being an input drive zone, the upper and lower surface of which is coated with an electrode respectively, and which is polarized along its thickness; and
   the third zone being an output generation zone, the output head of which is coated with an electrode and which is polarized along its length,
   wherein a height (H) of the first, second, and third zones is substantially equal to 2.72 mm.

2. The non-symmetric drive type piezoelectric ceramic transformer according to claim 1, wherein the piezoelectric ceramic transformer has three alternative oscillation modes, including λ/2, λ, 3 λ/2.

3. The non-symmetric drive type piezoelectric ceramic transformer according to claim 1, wherein said piezoelectric conductor is of single-layer.

4. The non-symmetric drive type piezoelectric ceramic transformer according to claim 1, wherein said piezoelectric conductor is composed of several simple-layer piezoelectric conductor which are added together and passing through monolithic process so as to form a multi-layer transformer.

5. The non-symmetric drive type piezoelectric ceramic transformer according to claim 3, wherein a polarization direction of said input drive zone is from top to bottom or from bottom to top.

6. The non-symmetric drive type piezoelectric ceramic transformer according to claim 3, wherein polarization direction of said output generation zones is right or left along its length.

7. The non-symmetric drive type piezoelectric ceramic transformer according to claim 4, wherein a polarization direction of said input drive zone is from top to bottom or from bottom to top.

8. The non-symmetric drive type piezoelectric ceramic transformer according to claim 4, wherein a polarization direction of said output generation zones is right or left along its length.

9. The non-symmetric drive type piezoelectric ceramic transformer according to claim 5, wherein the polarization direction of said output generation zones is right or left along its length.

10. The non-symmetric drive type piezoelectric ceramic transformer according to claim 1, wherein when the piezoelectric ceramic transformer operates under oscillation mode λ/2, null displacement oscillation nodes are located at a center of the transformer, an oscillating displacement of output head is greater than that of an input head, and an oscillating displacement diagram belongs to a non-symmetric type diagram.

11. The non-symmetric drive type piezoelectric ceramic transformer according to claim 1, wherein lengths and widths of the electrodes on the upper and lower surfaces of the second zone are substantially equal to 12.0 mm and 6.00 mm, respectively.

12. A non-symmetric drive piezoelectric ceramic transformer comprising:
    a rectangular piezoelectric conductor,
    wherein said rectangular piezoelectric conductor is divided into a first zone, a second zone, and a third zone along its length,
    the first zone being an oscillation node adjustment zone, the length of which is adjustable, so as to so as to be able to adjust a resonance frequency and oscillation node of said piezoelectric transformer;
    the second zone being an input drive zone, the upper and lower surface of witch is coated with an electrode respectively, and which is polarized along its thickness; and the third zone being an output generation zone, the output head of which is coated with an electrode and which is polarized along its length, wherein a height (H) of the first, second, and third zones is substantially equal to 2.72 mm, and a width (W) of the first, second, and third zones is substantially equal to 6.0 mm.

13. The non-symmetric drive type piezoelectric ceramic transformer according to claim 12, wherein lengths and widths of the electrodes on the upper and lower surfaces of the second zone arc substantially equal to 12.0 mm and 6.00 mm, respectively.

* * * * *